(12) United States Patent
Mantis et al.

(10) Patent No.: US 11,477,924 B2
(45) Date of Patent: Oct. 18, 2022

(54) APPARATUS AND METHODS FOR MITIGATING ELECTROMAGNETIC INTERFERENCE IN AN ELECTRONIC CONTROLLER

(71) Applicant: Hamilton Sundstrand Corporation, Charlotte, NC (US)

(72) Inventors: Constantinos J. Mantis, Westfield, MA (US); Edward John Marotta, Longmeadow, MA (US); James A. Gosse, Storrs, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 17/196,932

(22) Filed: Mar. 9, 2021

(65) Prior Publication Data

US 2021/0307219 A1  Sep. 30, 2021

Related U.S. Application Data

(60) Provisional application No. 63/000,906, filed on Mar. 27, 2020.

(51) Int. Cl.
| | | |
|---|---|---|
| *H05K 9/00* | (2006.01) | |
| *H05K 1/02* | (2006.01) | |
| *H05K 1/11* | (2006.01) | |

(52) U.S. Cl.
CPC ......... *H05K 9/0024* (2013.01); *H05K 1/0233* (2013.01); *H05K 1/111* (2013.01);
(Continued)

(58) Field of Classification Search
CPC .. H05K 1/0216; H05K 1/0233; H05K 1/0243; H05K 1/111; H05K 1/18;
(Continued)

(56) References Cited

U.S. PATENT DOCUMENTS 5,165,055 A   11/1992 Metsler
5,504,659 A * 4/1996 Acatay ................ H05K 9/0039
                                                333/182
(Continued)

FOREIGN PATENT DOCUMENTS

GB    2393326 A    3/2004

OTHER PUBLICATIONS

Extended European Search Report dated Jul. 1, 2021, received for corresponding European Application No. 21150300.8, 11 pages.
(Continued)

*Primary Examiner* — Hoa C Nguyen
*Assistant Examiner* — John B Freal
(74) *Attorney, Agent, or Firm* — Kinney & Lange, P.A.

(57) ABSTRACT

An interface for mitigating electromagnetic interference (EMI) on a printed circuit board (PCB) is disclosed. The PCB can contain circuit components and includes one or more signal planes sandwiched between corresponding ground planes. The PCB has a first and second side and an interface region separating the first and second sides that includes a partition wall projecting outward from the interface region, configured for EMI shielding between the first side and second sides, one or more pairs of input and output pads straddling the interface region on respective first and second sides and configured to accommodate an EMI line filter, and a ground barrier within the printed circuit board under the interface region. A method of mitigating EMI using the interface is also disclosed.

12 Claims, 6 Drawing Sheets

(52) U.S. Cl.
CPC ............ *H05K 9/006* (2013.01); *H05K 9/0037* (2013.01); *H05K 2201/0707* (2013.01)

(58) Field of Classification Search
CPC ........ H05K 1/181; H05K 1/182; H05K 1/183; H05K 5/0247; H05K 5/069; H05K 5/0026; H05K 5/0047; H05K 9/0024; H05K 9/0037; H05K 9/0039; H05K 9/0049; H05K 9/006; H05K 2201/0707; H05K 2201/093; H05K 2201/09309; H05K 2201/10015
See application file for complete search history.

(56) References Cited

U.S. PATENT DOCUMENTS

| | | | | |
|---|---|---|---|---|
| 5,566,040 | A | * | 10/1996 | Cosquer ............... H05K 9/0037 361/107 |
| 5,684,340 | A | * | 11/1997 | Soler ................... H05K 9/0039 361/818 |
| 6,023,202 | A | * | 2/2000 | Hill ..................... H04L 25/0266 333/24 C |
| 6,037,846 | A | * | 3/2000 | Oberhammer ....... H05K 9/0015 333/182 |
| 6,750,738 | B2 | * | 6/2004 | Lindenberger ....... H03H 1/0007 333/182 |
| 7,013,088 | B1 | | 3/2006 | Jiang et al. |
| 8,716,007 | B2 | | 5/2014 | Battrell et al. |
| 9,788,466 | B2 | | 10/2017 | Chen |
| 2003/0063453 | A1 | * | 4/2003 | Kusagaya ............ H05K 3/4641 361/794 |

OTHER PUBLICATIONS

API Technologies, Surface Mount EMI Filters—Three Terminal Chips, 6 pages, Fairview, PA.

* cited by examiner

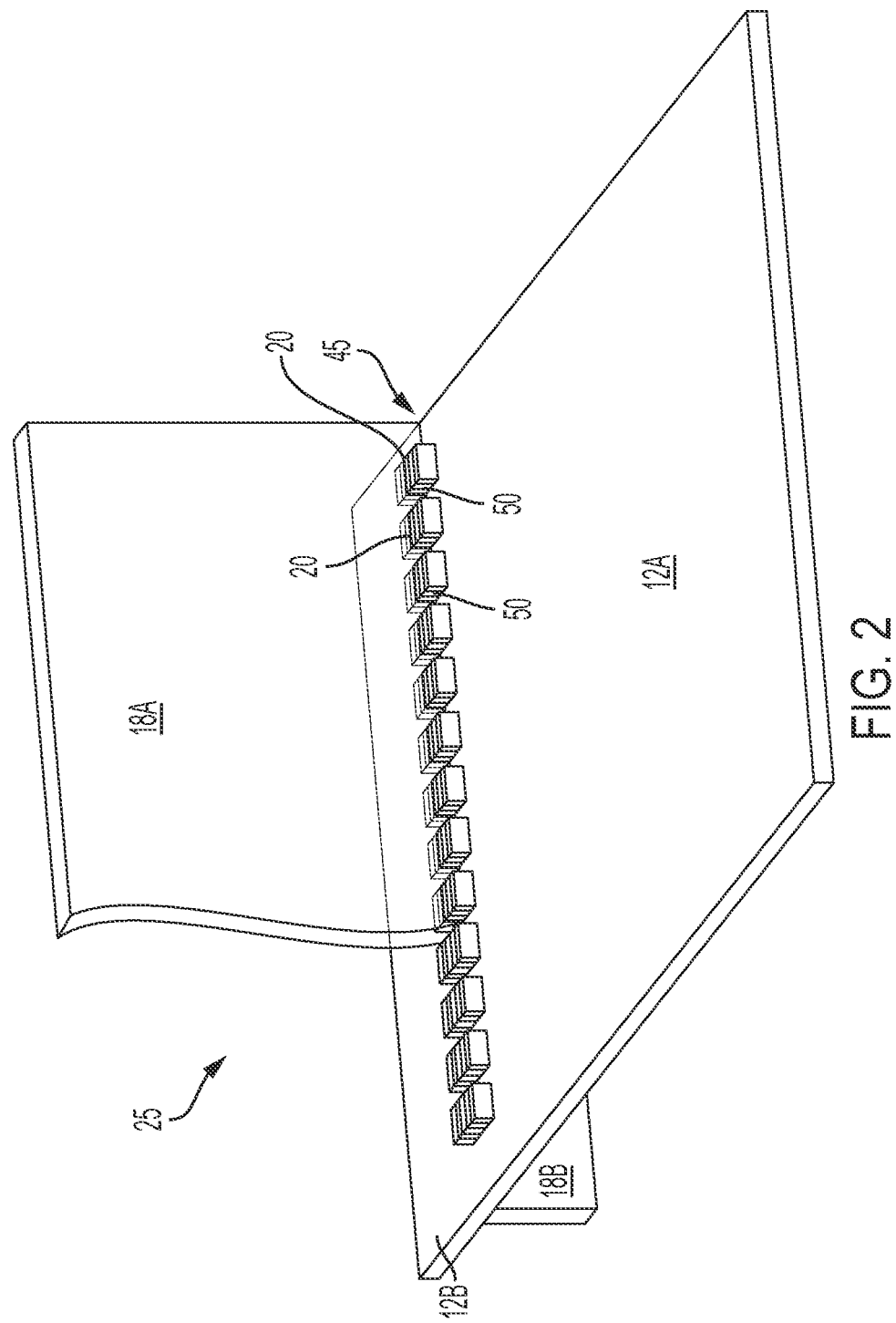

APPARATUS AND METHODS FOR MITIGATING ELECTROMAGNETIC INTERFERENCE IN AN ELECTRONIC CONTROLLER

CROSS-REFERENCE TO RELATED APPLICATION(S)

This application claims the benefit of U.S. Provisional Application No. 63/000,906 filed on Mar. 27, 2020, entitled "APPARATUS AND METHODS FOR MITIGATING ELECTROMAGNETIC INTERFERENCE IN AN ELECTRONIC CONTROOLER" by C. Mantis, E. Marotta and J. Gosse, which is incorporated by reference herein in its entirety.

BACKGROUND

The present application relates to electronic controllers, and more particularly, to apparatus and methods of mitigating electromagnetic interference in electronic controllers.

Electronic controllers can be susceptible to electromagnetic interference (EMI) from external sources that could adversely affect the operation of the electronic controller. Accordingly, considerable effort is made in designing electronic controllers and associated systems to mitigate EMI to eliminate or reduce the effect that EMI could otherwise cause. The use of shielded cabling is known in the electronic art, whereby one or more layers of electromagnetic shielding can surround cables that connect an electronic controller to external systems. A woven metal braid surrounding a cable is an example of shielding that can be used on a cable to reduce EMI. An electronic controller can include a large number of connections to other systems, often resulting in the use of numerous shielded cables. In a typical embodiment, numerous shielded cables are routed to an interface panel on the chassis on an electronic controller, while other shielded cables are used internally within the electronic controller to provide signal paths to and from various points within the electronic controller. While being effective in mitigating EMI, shielded cabling has an associated size, weight, and cost that must be accounted for. When used aboard an aircraft, for example, shielded cabling adds to the weight of the aircraft. The added weight can negatively impacting aircraft fuel efficiency. Shielded cabling can also be susceptible to damage caused by vibration, acceleration/deceleration, and/or contact with other components, people, and so forth, resulting in increased maintenance requirements. Moreover, performing installation and maintenance on shielded cabling on an electronic controller typically involves manual assembly operations, further increasing the overall cost associated with installing shielded cabling and performing maintenance on systems that include shielded cabling. Accordingly, a system for mitigating EMI in electronic controllers that reduces the amount of shielded cabling associated with these electronic controllers can be beneficial.

SUMMARY

An interface for mitigating electromagnetic interference (EMI) on a printed circuit board (PCB) is disclosed. The PCB can contain circuit components and includes one or more signal planes sandwiched between corresponding ground planes. The PCB defines an interface region, a PCB first side, and a PCB second side. The interface region separates the PCB first side from the PCB second side. The interface includes: a partition wall, projecting outward from the interface region, the partition wall configured to provide EMI shielding between the first side and the second side; one or more pairs of input pads and output pads, each straddling the interface region and configured to accommodate an EMI line filter, and a ground barrier located in the printed circuit board near the interface region. Each of the one or more input pads is located on the first side, and each of the one or more output pads is located on the second side.

A method of mitigating electromagnetic interference (EMI) on a printed circuit board (PCB) using an interface, the PCB configured to contain one or more circuit components, and the PCB having one or more signal planes sandwiched between a plurality of ground planes and defining an interface region, a PCB first side, and a PCB second side, the interface region separating the PCB first side from the PCB second side, the interface including a partition wall projecting outward from the interface region and configured to provide EMI shielding between the first side and the second side, one or more pairs of input pads and output pads, each straddling the interface region and configured to accommodate an EMI line filter, and a ground barrier disposed in the printed circuit board proximate the interface region. The method includes: receiving one or more filterable electrical signals at one or more input/output (I/O) connectors, each of the one or more I/O connectors being located on the PCB first side; transmitting each of the one or more filterable electrical signals through at least one of the one or more signal planes to the one or more pairs of input pads; and filtering, by one or more EMI line filters, each electrically connected to corresponding one or more input pads, the associated one or more filterable signals.

BRIEF DESCRIPTION OF THE DRAWINGS

FIG. 2 is a perspective cut-away view showing the EMI partition wall shown in FIG. 1.

DETAILED DESCRIPTION

A Faraday cage surrounds an electronic controller circuit card to establish a clean side, with an adjacent Faraday cage surrounding input/output connectors to establish a dirty side. A multiple-layer printed circuit board establishes different internal layers for filtered and unfiltered signal traces, each being sandwiched between ground planes. A metal wall dividing the clean and dirty sides includes feed-through EMI filters to pass signals between the dirty side and the clean side, thereby reducing or eliminating the bulk, weight, and cost associated with shielded cables and circuitry.

Figure 1:
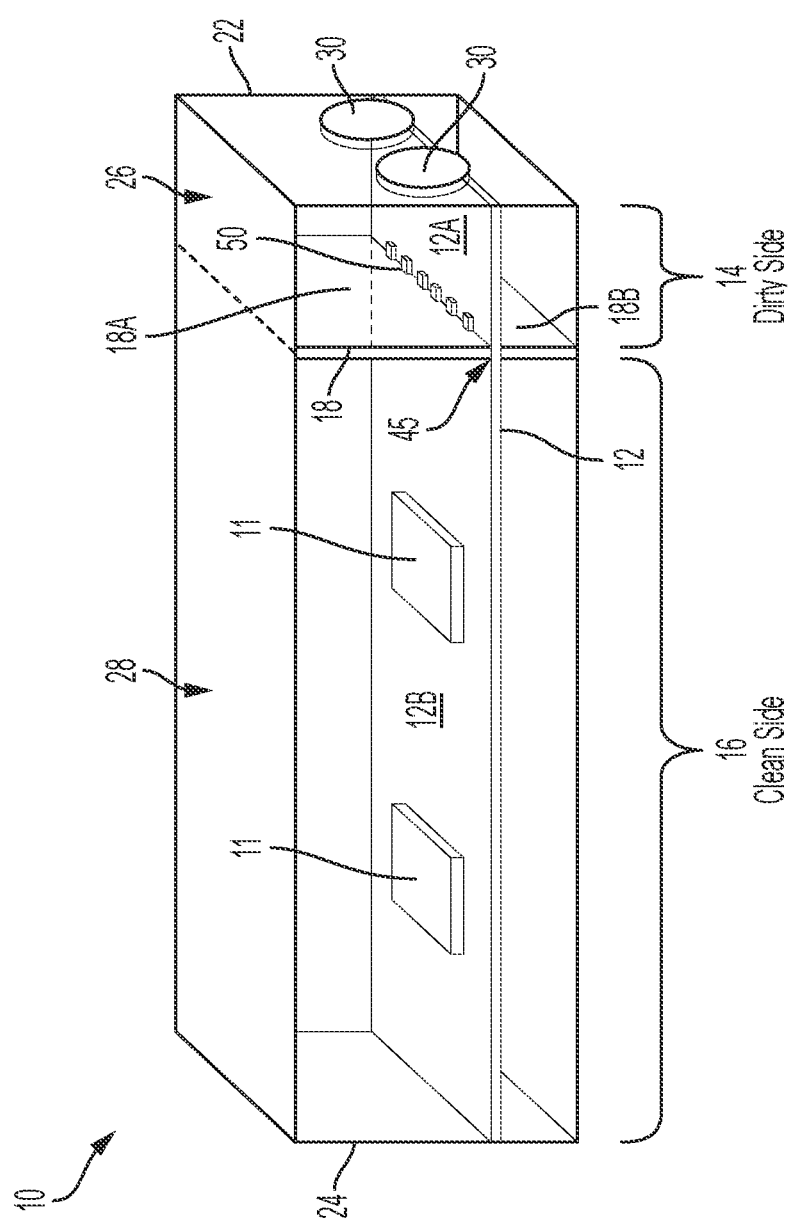
FIG. 1 is a perspective view of an electronic controller card assembly with electromagnetic interference (EMI) mitigation.

FIG. 1 is a perspective view of an electronic controller card assembly with electromagnetic interference (EMI) mitigation. Shown in FIG. 1 are electronic controller 10, components 11, printed circuit board (PCB) 12, PCB first side 12A, PCB second side 12B, first side 14, second side 16, partition wall 18, partition upper piece 18A, partition lower piece 18B, first side enclosure 22, second side enclosure 24, first side top 26, second side top 28, input/output (I/O) connector 30, interface region 45, and EMI line filters 50. Electronic controller 10 includes PCB 12 which is separated into PCB first side 12A and PCB second side 12B by partition wall 18. One or more components 11 (i.e., circuit components) are attached to PCB second side 12B, being electrically connected to various circuit traces (not shown in FIG. 1) on PCB second side 12B. First and second side enclosures 22, 24 enclose respective PCB first and second sides 12A, 12B, thereby forming first side 14 and second side 16. Partition wall 18, first side enclosure 22, and second side enclosure 24 together form a Faraday enclosure around respective first and second sides 14, 18, thereby providing EMI isolation.

A Faraday enclosure is known in the electrical art as being an electrically conductive material that surrounds a volume, thereby blocking electromagnetic fields from passing through the enclosure from outside into the enclosed volume and components located therein. A Faraday enclosure can also block electromagnetic fields existing inside the enclosed volume from passing through the enclosure to the outside. A Faraday enclosure can be made of one or more layers of conductive materials, including metals and/or non-metals. Copper, aluminum, steel, and aluminized mylar are non-limiting examples of conductive materials that can be used in forming a Faraday enclosure. A Faraday enclosure can also be referred to as a Faraday shield. In various embodiments, a Faraday enclosure can include sections of solid, perforated, and/or of woven conductive materials. Perforated or woven conductive materials can generally include apertures (i.e., perforations, holes, gaps) having an opening size that is no greater than the shortest wavelength of electromagnetic frequency that is desired to be shielded by the Faraday enclosure. A Faraday enclosure can be referred to as a Faraday cage. Accordingly, partition wall 18 and first side enclosure 22 form a Faraday enclosure (i.e., Faraday cage) around PCB first side 12A, providing EMI isolation of PCB first side 12A. Similarly, partition wall 18 and second side enclosure 24 form a Faraday enclosure (i.e., Faraday cage) around PCB second side 12B (i.e., and components 11 contained thereon), providing EMI isolation of PCB second side 12B. EMI isolation of a respective PCB first or second side 12A, 12B is with respect to the other, and also with respect to the external environment (i.e., external to electronic controller 10), the importance of which will be described. Accordingly, EMI isolation between first and second sides 12A, 12B occurs at interface region 45. Partition wall 18 includes partition upper piece 18A and partition lower piece 18B, each on the respective top and bottom of PCB 12 as shown. Partition wall 18 can also be referred to as an EMI partition wall.

As noted earlier, one or more components 11 on PCB second side 12B can receive various electrical signals, perform various functions, and/or produce other electronic signals. Component 11 can also be referred to as a circuit component, as an electronic assembly, or as a circuit card assembly. Computing and calculating circuits, timing circuits, radio transceivers, digital and analog signal processors, and electronic recording systems are non-limiting examples of components 11 that can be included in electronic controller 10. For example, electrical signals can be communicated between electronic controller 10 (i.e., components 11 contained therein) and various sensors, emitters, actuators, detectors, and communications devices. These various circuits can require shielding from external sources of EMI (i.e., from the outside of second side enclosure 24) that could otherwise interfere with their operation. Moreover, these various circuits can also produce electromagnetic signals for which shielding is desirable to prevent their transmission to an external environment (i.e., to the outside of second side enclosure 24). The various input and output signals are provided to and from electronic controller 10 via I/O connectors 30 located on first side 14, which will be described in greater detail in FIGS. 3A and 4. The various signals provided to and from I/O connectors 30 can include undesired signals (i.e., electrical noise), upon which EMI filtering can be performed. Accordingly, one or more EMI line filters 50 provide EMI filtering of at least some of the various signal paths between I/O connectors 30 and second side 16 (including PCB second side 12B). Therefore, first side 14 can be referred to as the dirty side, and second side 16 can be referred to as the clean side, with the terms of "dirty" and "clean" referring to the EMI environment (i.e., the possible EMI environment), meaning that undesirable EMI can exist on the dirty side, and that unwanted EMI is filtered (i.e., cleansed) before passing to the clean side. An aircraft is a non-limiting example of a platform where electronic controller 10 can be installed. Non-limiting examples of sources of EMI include electromagnetic emanations from other electrical circuits and components within the aircraft, on the exterior of the aircraft, and in the environment outside of the aircraft. Power cables, communications cables, and antennas, for example, can generate electromagnetic and/or electric fields that can cause EMI. In some cases, evanescent electric fields can cause EMI. Various sources can manifest as conducted EMI, radiated EMI, or both. Other aircraft, antennas (e.g., broadcast, communications, radar), high-intensity radiated fields (HIRF), static electricity, and electromagnetic pulse (EMP) are examples of external sources of EMI. The scope of the present disclosure includes electronic controllers 10 regardless of location or use, with non-limiting examples of locations including aircraft, spacecraft, land vehicles, ships, and buildings. EMI line filters 50 can also be referred to as EMI filters.

FIG. 2 is a perspective cut-away view showing partition wall 18 (i.e., EMI partition wall), which includes partition upper piece 18A and partition lower piece 18B shown in FIG. 1, while also showing a number of partition apertures 20 in partition upper piece 18A, each for an associated EMI line filter 50. Partition apertures 20 can also be referred to as partition cut-outs, as EMI filter cut-outs, or as EMI line filter cut-outs. Partition wall 18, interface region 45, associated EMI line filters 50, and PCB 12, provide EMI separation between PCB first side 12A and PCB second side 12B. Collectively, partition wall 18, associated EMI line filters 50, and the design of PCB 12 form EMI mitigating interface 25. It is known in the electrical art that many electromagnetic signals cannot be entirely blocked (i.e., reduced to zero), but are instead attenuated to desirable values. Signal attenuation can be expressed as a ratio between an incident signal and an attenuated signal that can span orders of magnitude, thereby typically using decibels (dB) as a means of expressing the ratio, as is understood in the electrical art. Accordingly, EMI mitigating interface 25 attenuates EMI from first side 14 (i.e., dirty side) to second side 16 (i.e., clean side). EMI mitigating interface 25 can also be referred to as an EMI separation interface. EMI line filters 50 will be shown and described in more detail in FIGS. 3A-3B. The design of PCB 12 will be shown and described in more detail in FIGS. 4 and 6.

Figure 3A:
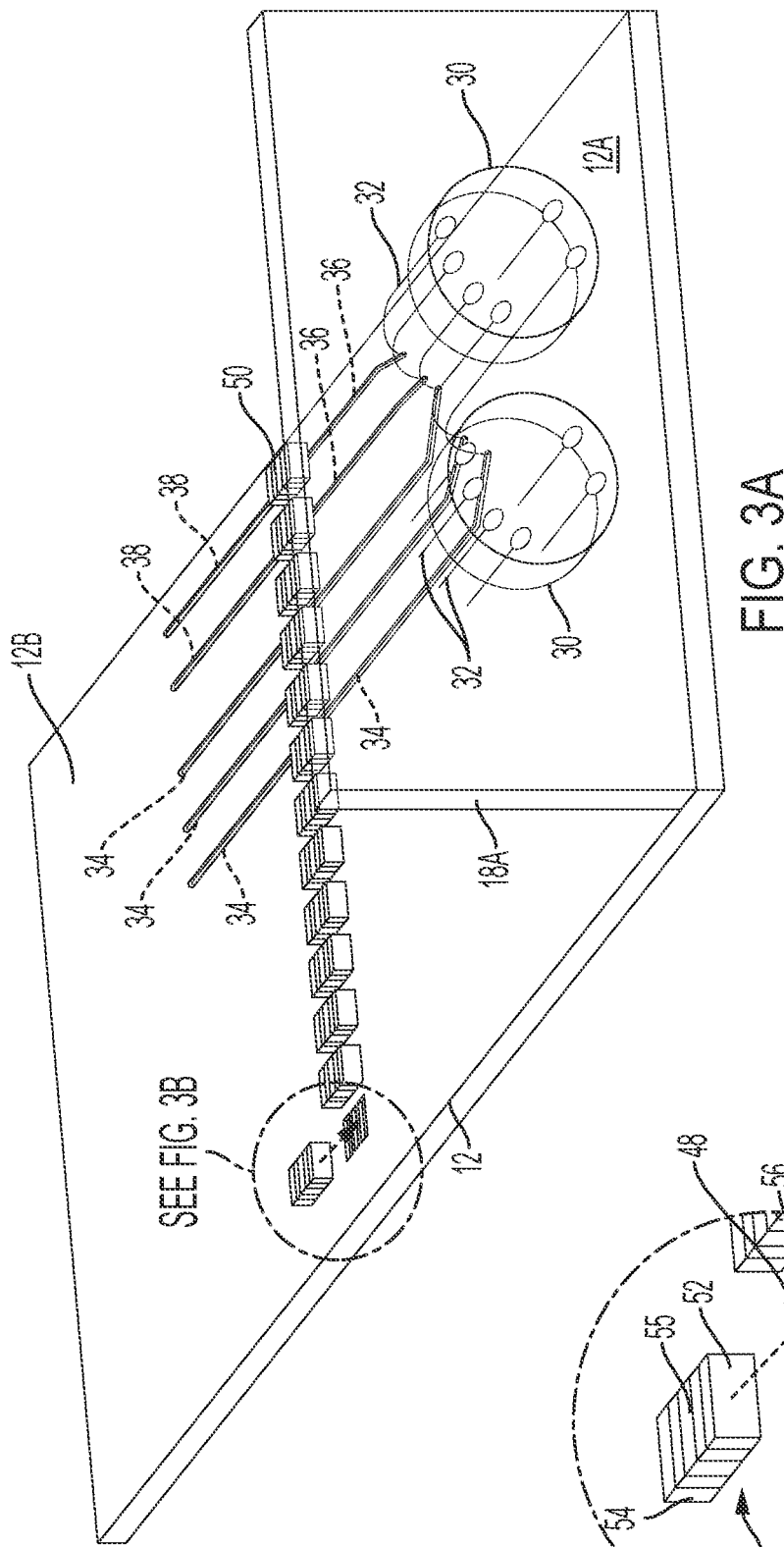
FIG. 3A is a perspective view showing the printed circuit board and EMI line filters shown in FIG. 2.
Figure 3B:
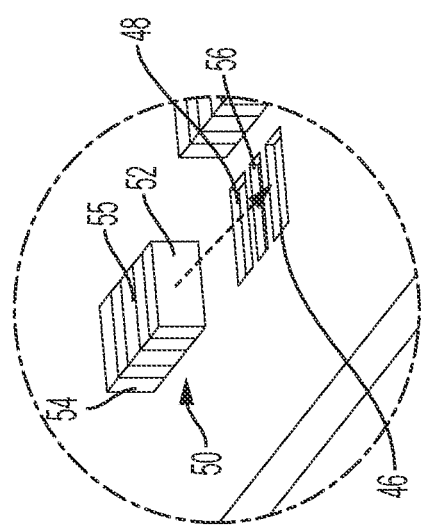
FIG. 3B is an enlargement of an EMI line filter shown in FIG. 3A.

FIG. 3A is a perspective view showing PCB 12 and EMI line filters 50 shown in FIG. 2. FIG. 3B is an enlargement of an EMI filter 50 shown in FIG. 3A. Shown in FIGS. 3A-3B are PCB 12, PCB first side 12A, PCB second side 12B, I/O connector 30, I/O connector leads 32, unfiltered traces 34, input traces 36, filtered traces 38, interface region 45, input pad 46, output pad 48, EMI line filters 50, input terminals 52, output terminals 54, ground terminals 55, and ground barrier 56. Unfiltered traces 34, input traces 36, and filtered traces 38 are depicted as embedded traces within PCB 12, and will be shown and described in more detail in FIGS. 4 and 6. I/O connectors 30 are attached to PCB first side 12A, each I/O connector 30 including a number of I/O connector leads 32 to various embedded conductive traces within PCB first side 12A (i.e., within PCB 12). Accordingly, PCB 12 can be referred to as a multi-layer PCB, or as a shielded multi-layer PCB.

In the illustrated embodiment, each of several I/O connector leads 32 are electrically connected to an associated unfiltered trace 34. The signal on each unfiltered trace 34 can be referred to as a non-filterable signal, for which it is desirable to not filter the signal by an EMI filter 50. A non-filterable signal is a signal that would not retain sufficient usefulness and/or integrity while passing through an EMI filter 50, and which is therefore provided without EMI filtering to a circuit component located on PCB second side 12B. Non-limiting examples of non-filterable signals include digital signals (e.g., digital communications carried on a data bus) having abrupt transitions, timing signals, and analog waveforms having intelligible frequency content that is near the frequency content of EMI. Each unfiltered trace 34 carries a non-filterable signal from an associated I/O connector lead 32 to a circuit component located on PCB second side 12B.

In the illustrated embodiment, each of several other I/O connector leads 32 are electrically connected to an associated input trace 36. The signal on each input trace 36 can be referred to as a filterable signal, capable of being filtered by an associated EMI filter 50 while passing from PCB first side 12A to PCB second side 12B, or from PCB second side 12B to PCB first side 12A. A filterable signal is a signal that can pass through an associated EMI filter 50 while retaining usefulness and/or integrity. Non-limiting examples of filterable signals include direct current (DC) voltages, status condition signals having discrete values, and analog waveforms having useful frequency content that is below the frequency range of EMI. Each input trace 36 terminates as an associated input pad 46 (see FIG. 3B) on PCB first side 12A, which is electrically connected to an input terminal 52 of an associated EMI filter 50. Each pair of an input pad 46 and output pad 48 can be said to be straddling interface region 45. Each EMI filter 50 has a corresponding output terminal 54 which is electrically connected to an associated output pad 48 on PCB second side 12B, from which an associated filtered trace 38 begins. Each EMI filter 50 also has a corresponding ground terminal 55 which is electrically connected to an associated ground barrier 56. Vias (not shown in FIGS. 3A-3B) provide electrical connections to and from various input traces 36 and filtered traces 38 (i.e., embedded traces) within PCB 12. Each filtered trace 38 provides an electrical connection to a circuit component located on PCB second side 12B. Each EMI filter 50 includes a filter network that can have one or more circuit elements that together function to perform a desired EMI filtering function. Examples of filter networks that can be used include the following: inductor, capacitor, inductor-capacitor (i.e., L-C), inductor-capacitor-inductor (i.e., L-C-L, T-configuration), and capacitor-inductor-capacitor (i.e., C-L-C, it-configuration) which provide EMI filtering between the respective input terminal 52 and output terminal 54 with respect to ground terminal 55. In some embodiments, different EMI filters 50 in EMI mitigating interface 25 can include different filter networks. In specifying a particular filter network for one or more EMI filters 50, an attenuation level can be stated for a particular frequency, or for a particular range of frequencies. In the illustrated embodiment, EMI filter 50 (i.e., filter network) can provide attenuation over a broad frequency band. An exemplary EMI filter 50 can provide at least 10 dB attenuation at 10 MHz, and at least 45 dB attenuation at 1 GHz. In some embodiments, EMI filter 50 can provide at least 20 dB attenuation at 10 MHz, and/or at least 50 dB attenuation at 1 GHz. In other embodiments, EMI filter 50 can provide at less than 10 dB attenuation at 10 MHz and/or less than 45 dB attenuation at 1 GHz. In various embodiments, EMI filter 50 can be configured to provide a minimum attenuation level at one or more different frequencies or range of frequencies. EMI filter 50 shown in FIGS. 3A-3B can be described as being a surface mount device (SMD) (i.e., involving surface mount technology (SMT)). In various embodiments, the packaging of EMI filter 50 can be different from that shown in the illustrated embodiment. In the illustrated embodiment, EMI filters 50 are mounted on the top surface of PCB 12, with the top surface being the surface that is directed toward first and second side tops 26, 28 as shown in FIG. 1. In some embodiments, EMI filters 50 can be mounted on the bottom surface of PCB 12 (i.e., the surface opposite the top surface) in addition to and/or instead of the top surface of PCB 12.

Referring again to FIGS. 3A-3B, electronic controller 10 (i.e., PCB first side 12A, first side 14) includes two I/O connectors 30, each providing connections to both filterable and non-filterable signals. In some embodiments, electronic controller 10 can include only one I/O connector 30. In other embodiments, electronic controller 10 can include three or more I/O connectors 30. In any of these embodiments, one or more of the I/O connectors 30 can be connected only to unfiltered traces 34, or only to input traces 36. Moreover, any of the I/O connectors 30 in a particular embodiment can have a different number of I/O connector leads 32 from any of the others. In the illustrated embodiment, one or more of the I/O connectors 30 are mounted vertically (i.e., on a plane perpendicular to PCB 12). In some embodiments, one or more of the I/O connectors 30 can be mounted horizontally (i.e., parallel to PCB 12). In other embodiments, one or more of the I/O connectors 30 can be mounted on one or more external surfaces of first side enclosure 22. In an exemplary embodiment, one or more I/O connectors 30 can be mounted vertically, and one or more other I/O connectors 30 can be mounted horizontally.

Figure 4:
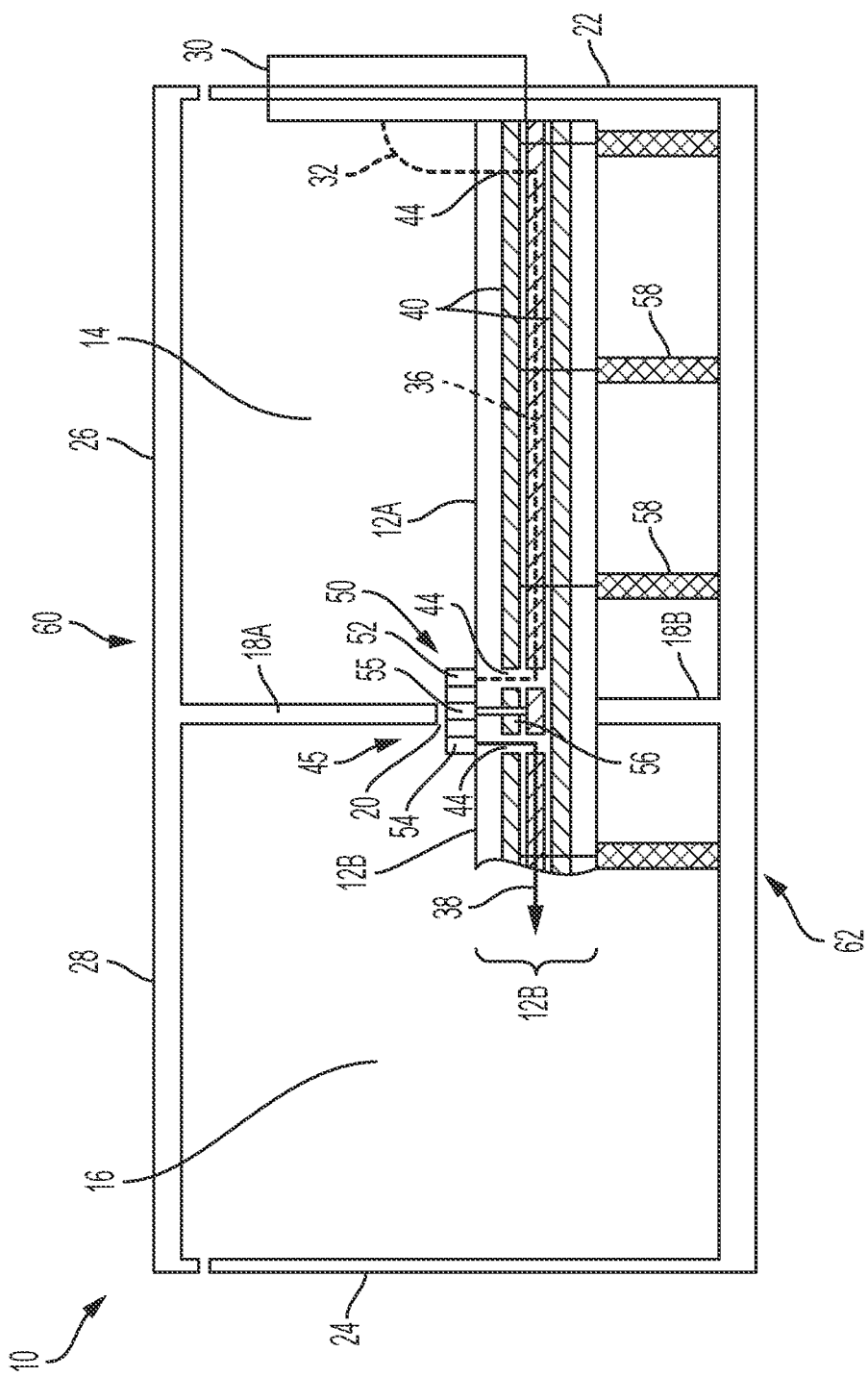
FIG. 4. is a cross-sectional side view showing the EMI mitigating interface shown in FIG. 2.

FIG. 4. is a cross-sectional side view of EMI mitigating interface 25 shown in FIG. 2. Shown in FIG. 4 are electronic controller 10, PCB 12, PCB first side 12A, PCB second side 12B, first side 14, second side 16, partition upper piece 18A, partition lower piece 18B, partition aperture 20, first side enclosure 22, second side enclosure 24, first side top 26, second side top 28, I/O connector 30, I/O connector lead 32, input trace 36, filtered trace 38, ground planes 40, vias 44, interface region 45, EMI line filters 50, input terminal 52, output terminal 54, ground terminal 55, ground barrier 56, posts 58, clamshell top 60, and clamshell base 62. The descriptions of electronic controller 10, PCB 12, PCB first side 12A, PCB second side 12B, first side 14, second side 16, partition upper piece 18A, partition lower piece 18B, partition aperture 20, first side enclosure 22, second side enclosure 24, first side top 26, second side top 28, I/O connector 30, I/O connector lead 32, input trace 36, filtered trace 38, interface region 45, EMI line filters 50, input terminal 52, output terminal 54, and ground terminal 55 are all substantially similar to those provided above in regard to FIGS. 1-2 and 3A-3B. PCB first side 12A and PCB second side 12B (i.e., PCB 12) is a shielded multi-layer PCB whereby input trace 36 and filtered trace 38 are each sandwiched between ground planes 40 above and below (i.e., in other layers). Dielectric materials separating input trace 36 and filtered trace 38 are not shown in FIG. 4, but will be shown and described later in FIG. 6. Vias 44 provide electrical connections across one or more layers. Ground barrier 56 provides in-layer shielding between input trace 36 and filtered trace 38. Posts 58 provide structural support for PCB 12 within electronic controller 10 (i.e., within first side 14 and second side 16). The illustrated embodiment can be referred to as a clamshell configuration, in which electronic controller 10 includes clamshell top 60 and clamshell base 62. Clamshell top 60 includes partition upper piece 18A, first side top 26, and second side top 28. As will be shown later in FIG. 5, clamshell top 60 is separable from clamshell base 62, which can be beneficial for fabricating electronic controller 10, and for performing testing, maintenance, and the like.

Figure 5:
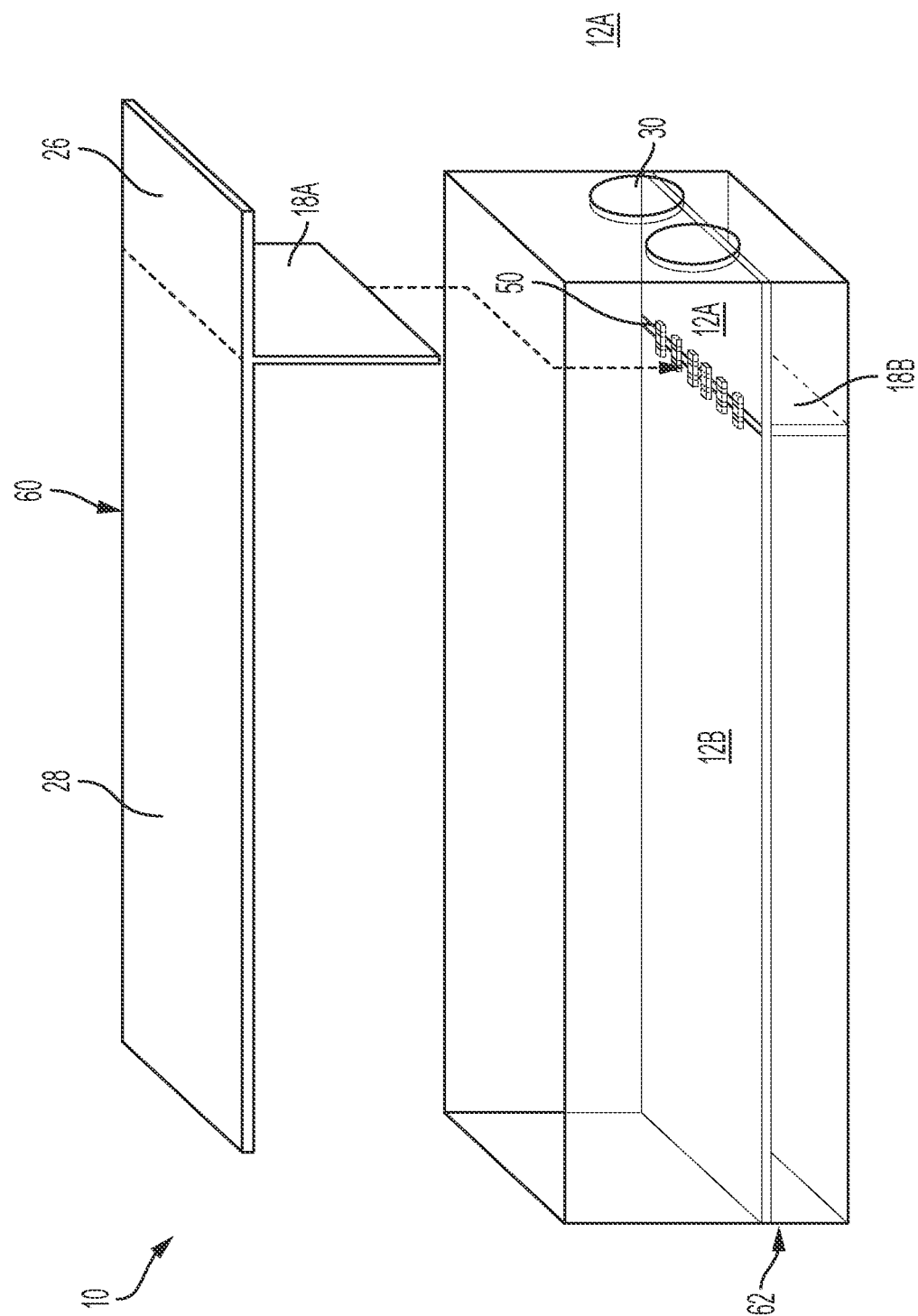
FIG. 5 is an exploded perspective view showing the clamshell arrangement shown in FIG. 4.

FIG. 5 is an exploded perspective view showing the clamshell arrangement shown in FIG. 4, labeling several features that were shown and described above in regard to FIG. 4. A fewer number of EMI line filters 50 is shown in FIG. 5, for illustration clarity. In the illustrated embodiment, clamshell top 60 (i.e., partition upper piece 18A, first side top 26, and second side top 28) is shown removed from clamshell base 62 (i.e., in an "open" position). When clamshell top 60 is matably attached to clamshell base 62 (i.e., when in a "closed" position), the structural integrity of electronic controller 10 completes the Faraday enclosure (i.e., Faraday shield, Faraday cage) as described above in regard to FIG. 1. A system for securely fastening clamshell top 60 to clamshell base 62 is not shown, but would be readily understood by a person skilled in the mechanical art. The clamshell arrangement depicted in FIGS. 4-5 is exemplary, and many other designs are possible for electronic controller 10 which can allow an opening and closing of electronic controller 10 for various reasons, while all being in the scope of the present disclosure. In some embodiments, various peripheral sections (not labeled) of electronic controller 10 can be configured to be openable and/or removable by various means. For example, in an embodiment, a hinged mechanism can be used to allow the opening of a peripheral section of electronic controller 10.

Figure 6:
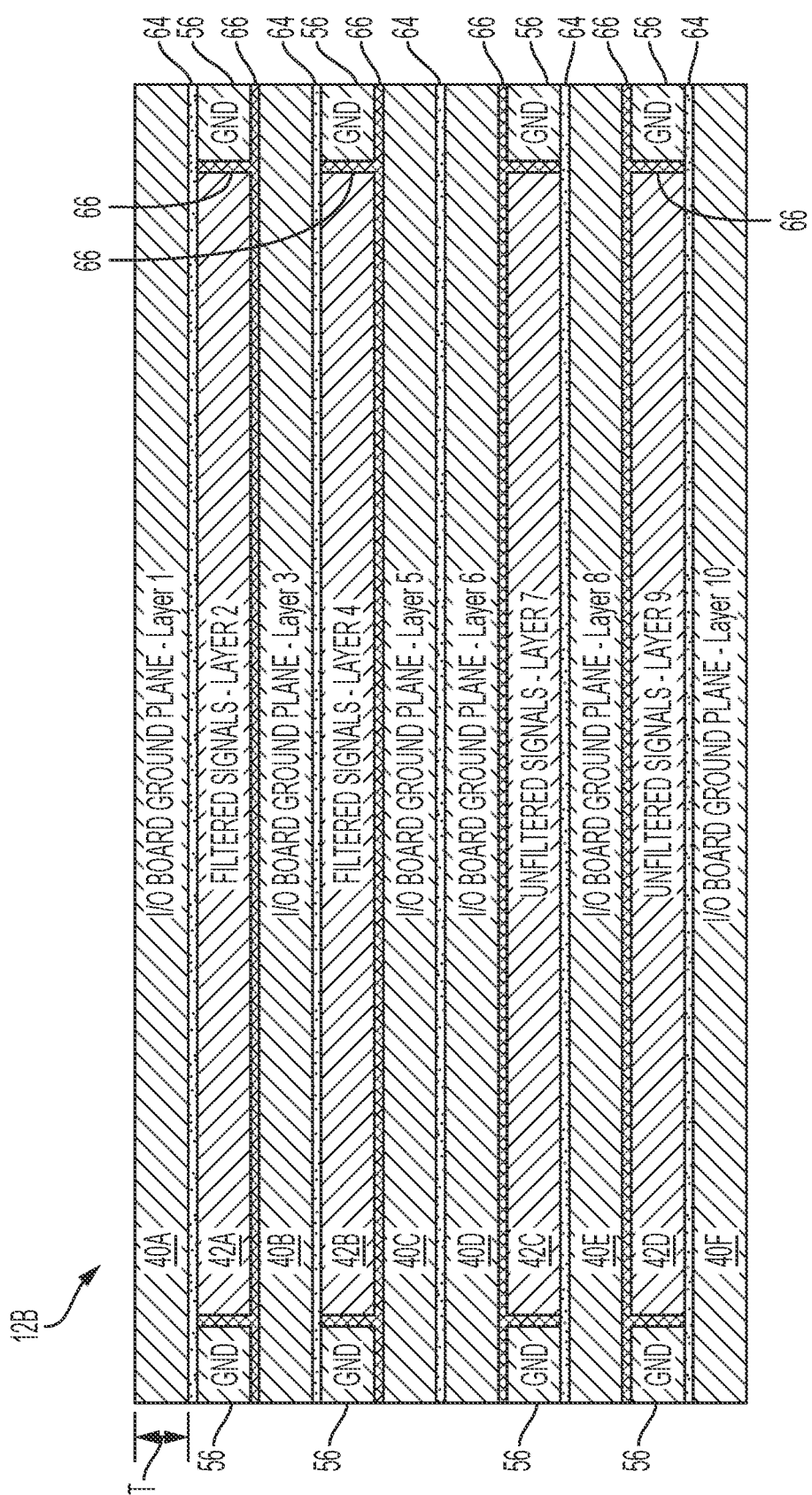
FIG. 6 is a cross-sectional side view showing the printed circuit board shown in FIG. 4.

FIG. 6 is a cross-sectional side view showing printed circuit board 12 shown in FIG. 4. FIG. 6 is labeled to depict a cross-section of PCB second side 12B, while not showing features associated with EMI mitigating interface 25. Shown in FIG. 6 are PCB second side 12B, ground planes 40, signal planes 42, ground barriers 56, prepreg layers 64, and dielectric layers 66. Also labeled in FIG. 6 is ground plane thickness T. In the illustrated embodiment, PCB second side 12B includes six layers of ground planes 40, numbered ground plane 40A-40F, respectively. Each ground plane 40 can also be referred to as an I/O ground plane, or as an I/O board ground plane because of the shielding provided for I/O signals. PCB second side 12B also includes four layers of signal planes 42, each numbered signal plane 42A-42D, respectively. Each respective signal plane 42 is sandwiched between adjacent ground planes 40. Accordingly, adjacent ground planes 40 provide EMI shielding of each respective signal plane 42 sandwiched between. Ground planes 40 and signal planes 42 are electrically conductive and can be made of a metal or a metal alloy. Copper is an exemplary metal that can be used for ground planes 40 and signal planes 42. The various conductive layers of ground planes 40 and signal planes 42 can be labeled as layer 1 through layer 10, as shown in FIG. 6. Accordingly, PCB 12 (i.e., PCB second side 12B and PCB first side 12A) can be referred to as a ten-layer PCB. In some embodiments, PCB 12 can include more than 10 layers. In other embodiments, PCB 12 can include fewer than 10 layers. For example, in an exemplary embodiment in which electronic controller uses an EMI filter 50 on all signals from/to I/O connector 30, a single input trace 36 can be used on PCB first side 12A, with an associated single filtered trace 38 being used on PCB second side 12B. Therefore, in this exemplary embodiment, unfiltered traces 34 can be omitted, and PCB 12 can include one signal plane 42 sandwiched between two ground planes 40. All numbers of layers for PCB 12 are within the scope of the present disclosure.

Referring again to FIG. 6, each signal plane 42 of PCB first side 12B is designated as either unfiltered trace 34 or filtered trace 38, with each filtered trace 38 having an associated input trace 36 on corresponding PCB first side 12A, as shown and described above in regard to FIGS. 3A-3B. In the illustrated embodiment, two signal planes 42 are used for unfiltered traces 34. Additionally, two signal planes 42 are used for filtered traces 38, with each having associated input traces 36 on associated PCB first side 12A. Each signal plane 42 is surrounded on the periphery (i.e., edges as shown in FIG. 6) by an associated ground barrier 56 which provides EMI isolation of the respective enclosed signal plane 42. Accordingly, ground barriers provide EMI separation between respective input traces 36 and filtered traces 38 at the interface between PCB first side 12A and PCB second side 12B (i.e., near partition wall 18, as shown and described above in regard to FIGS. 3A-3B and 4-5).

An electrical dielectric material separates adjacent conductive layers (i.e., ground planes 40, signal planes 42), as described above in regard to FIG. 4. In the illustrated embodiment, the electrical dielectric material is either a prepreg layer 64 or dielectric layer 66. Prepreg layer 64 is a material that is known in the PCB art as being a preimpregnated layer of fiberglass impregnated with resin (i.e., an epoxy-based material). Prepreg layer 64 can also be referred to as a glass-reinforced epoxy laminate sheet, which is useful during the manufacturing of PCB 12 to hold the various conductive layers (i.e., ground planes 40 and signal planes 42) together. In the illustrated embodiment, one or more dielectric layers 66 can be used to electrically isolate adjacent conductive layers (i.e., ground planes 40, signal planes 42). A dielectric 66 also electrically isolates each ground barrier 56 from the associate signal plane 42. In some embodiments, one or more prepreg layer 64 can be interchanged with a corresponding dielectric layer 66.

Referring again to FIG. 6, ground plane 40 has ground plane thickness T representing the thickness of ground planes 40 (i.e., I/O ground planes, electrically conductive layers). In a particular embodiment, ground plane thickness T can be selected to provide a desired level of attenuation (i.e., mitigation) for EMI. When an acceptable level of EMI attenuation exists under a specific condition, this can be referred to as "EMI isolation". Examples of various factors that can determine the value of ground plane thickness T in a particular embodiment (i.e., under a particular condition) include the frequency spectrum of the anticipated EMI, the degree of EMI attenuation (i.e., attenuation factor), and the type of material used for ground plane 40. It can be beneficial to not use values of ground plane thickness T greater than is necessary for a particular embodiment in order to contain the size, weight, and cost of PCB 12, for example. In an exemplary embodiment, ground planes 40 are made of copper and ground plane thickness T is about 35 μm (0.0014 inch, 1.4 mils). In the PCB art, this exemplary value of ground plane thickness T can be referred to as "1 ounce weight copper", because 1 ft$^2$ (0.0929 m$^2$) weighs about 1 ounce (28.35 gm). In a particular evaluation, ground plane 40 made of copper and having ground plane thickness T of about 35 μm (0.0014 inch, i.e., "1 ounce weight copper") provided EMI attenuation of about 85 dB for frequencies at and below 2 GHz. In another exemplary embodiment, ground plane thickness T can be about 18 μm (0.7 mils, i.e., "½ ounce weight copper"). In yet another exemplary embodiment, ground plane thickness T can be about 71 μm (2.8 mils, i.e., "2 ounce weight copper"). All values of ground plane thickness T are within the scope of the present disclosure. Moreover, all materials for ground planes 40 are within the scope of the present disclosure, with the level of EMI attenuation depending on several factors including the thickness and material of ground planes 40. In yet another exemplary embodiment, each ground plane 40 can provide EMI attenuation of at least 40 dB over the frequency range from 30 MHz-10 GHz.

Referring again to FIG. 6, some ground planes 40 provide EMI attenuation (i.e., mitigation, isolation) between a signal plane 42 and a region outside of PCB second side 12B (i.e., PCB 12), with ground planes 40A (i.e., I/O board ground plane layer 1) and 40F (i.e., I/O board ground plane layer 10) being examples. Other ground planes 40 provide EMI attenuation between adjacent signal planes 42. In various embodiments, the level of EMI attenuation by various ground planes 40 can be different depending on the location of the specific ground plane 40 (i.e., 40A, 40B, 40C, 40D, 40E, 40F). Therefore, in some embodiments, plane thickness T can be different for various specific ground planes 40

Discussion of Possible Embodiments

The following are non-exclusive descriptions of possible embodiments of the present invention. [This will be completed following RM approval of the claims.]

An interface for mitigating electromagnetic interference (EMI) on a printed circuit board (PCB) configured to contain one or more circuit components, the PCB comprising one or more signal planes sandwiched between a plurality of ground planes and defining an interface region, a PCB first side, and a PCB second side, the interface region separating the PCB first side from the PCB second side, the interface comprising: a partition wall, projecting outward from the interface region, the partition wall configured to provide EMI shielding between the first side and the second side; one or more pairs of input pads and output pads, each of the one or more pairs straddling the interface region and configured to accommodate an EMI line filter; wherein: each of the one or more input pads is disposed on the first side; and each of the one or more output pads is disposed on the second side; and a ground barrier disposed in the printed circuit board proximate the interface region.

The interface of the preceding paragraph can optionally include, additionally and/or alternatively, any one or more of the following, configurations and/or additional components:

A further embodiment of the foregoing interface, wherein: each ground plane comprises copper; each ground plane defines a ground plane thickness; and the ground plane thickness is about 0.0014 inch (35 μm).

A further embodiment of the foregoing interface, wherein each ground plane is configured to provide at least 40 dB attenuation of EMI frequencies between 30 MHz-10 GHz.

A further embodiment of the foregoing interface, further comprising one or more input/output (I/O) connectors disposed on the PCB first side, each of the one or more I/O connectors comprising one or more I/O connector leads and configured to electrically couple the one or more circuit components to one or more external electrical systems.

A further embodiment of the foregoing interface, further comprising: a first side EMI cage that surrounds the first side and is configured to mitigate transmission of EMI between the first side and an external environment; and one or more input/output connector apertures disposed on the first side EMI cage, each configured to accommodate an input/output connector; wherein each of the one or more input/output connectors passes through an associated input/output connector aperture.

A further embodiment of the foregoing interface, further comprising: a second side EMI cage that surrounds the second side and is configured to mitigate transmission of EMI between the second side and the external environment.

A further embodiment of the foregoing interface, wherein at least one of the one or more signal planes is configured to carry one or more filterable signals from the one or more I/O connectors to the interface, wherein each of the one or more signal planes is comprised of one or more input traces, each configured to transmit filterable electrical signals between the one or more I/O connector leads and the one or more EMI line filters.

A further embodiment of the foregoing interface, wherein the PCB comprises at least two signal planes, defining a first signal plane and a second signal plane, wherein: the first signal plane is configured to transmit filterable electrical signals between the one or more I/O connector leads and the one or more EMI line filters; each of the one or more EMI line filters is configured to attenuate EMI in each of the associated filterable electrical signals; and the second signal plane is configured to transmit unfilterable electrical signals from the one or more I/O connector leads across the interface by bypassing the one or more EMI line filters.

A further embodiment of the foregoing interface, wherein the PCB comprises alternating dielectric layers and conductive layers, each conductive layer configured to be: (a) a filtered signal layer; (b) an unfiltered signal layer; or (c) a ground plane.

A further embodiment of the foregoing interface, wherein the PCB comprises: one or more filtered signal layers; and two or more ground planes.

A further embodiment of the foregoing interface, further comprising one or more EMI line filters, each matably attachable to an associated pair of input and output pad and configured to: transfer an electrical signal from the respective input pad to the respective output pad; and mitigate transmission of EMI from the input pad to the output pad and/or from the output pad to the input pad.

A further embodiment of the foregoing interface, wherein each of the one or more EMI line filters comprises an inductor, a capacitor, and inductor-capacitor, an inductor-capacitor-inductor, or a capacitor-inductor-capacitor network.

A further embodiment of the foregoing interface, wherein each of the one or more EMI line filters is configured to provide EMI attenuation of: at least 10 dB at 10 MHz; and at least 45 dB at 1 GHz.

A further embodiment of the foregoing interface, comprising an electronic controller further comprising: a PCB; a first side enclosure, configured to provide EMI shielding; and a second side enclosure, configured to provide EMI shielding; wherein the first side enclosure and the second side enclosure together form a Faraday shield around the PCB.

A further embodiment of the foregoing interface, further comprising a clamshell configuration, the clamshell configuration comprising a clamshell top and a clamshell base, wherein: the partition is physically separable at the PCB into an upper portion and a lower portion; the clamshell top includes the upper portion; and the clamshell top is configured to be removably separated from the clamshell base.

A method of mitigating electromagnetic interference (EMI) on a printed circuit board (PCB) using an interface, the PCB configured to contain one or more circuit components, and the PCB comprising one or more signal planes sandwiched between a plurality of ground planes and defining an interface region, a PCB first side, and a PCB second side, the interface region separating the PCB first side from the PCB second side, the interface comprising a partition wall projecting outward from the interface region and configured to provide EMI shielding between the first side and the second side, one or more pairs of input pads and output pads, each straddling the interface region and configured to accommodate an EMI line filter, and a ground barrier disposed in the printed circuit board proximate the interface region, the method comprising: receiving one or more filterable electrical signals at one or more input/output (I/O) connectors, each of the one or more I/O connectors disposed on the PCB first side; transmitting each of the one or more filterable electrical signals through at least one of the one or more signal planes to the one or more pairs of input pads; and filtering, by one or more EMI line filters, each electrically connected to corresponding one or more input pads, the associated one or more filterable signals.

The method of the preceding paragraph can optionally include, additionally and/or alternatively, any one or more of the following features, configurations and/or additional components:

A further embodiment of the foregoing method, wherein the PCB comprises at least two signal planes, defining a first signal plane and a second signal plane, wherein: the first signal plane is configured to transmit filterable electrical signals between the one or more I/O connector leads and the one or more EMI line filters; each of the one or more EMI line filters is configured to attenuate EMI in each of the associated filterable electrical signals; and the second signal plane is configured to transmit unfilterable electrical signals from the one or more I/O connector leads across the interface by bypassing the one or more EMI line filters.

A further embodiment of the foregoing method, further comprising: mitigating, using a first side EMI cage that surrounds the first side, the transmission of EMI between the first side and an external environment; and mitigating, using a second side EMI cage that surrounds the second side, the transmission of EMI between the side and the external environment.

A further embodiment of the foregoing method, wherein the PCB comprises: one or more filtered signal layers; and two or more ground planes.

A further embodiment of the foregoing method, wherein: each ground plane comprises copper; each ground plane defines a ground plane thickness; the ground plane thickness is about 0.0014 inch (35 µm); and each ground plane is configured to provide at least 40 dB attenuation of EMI frequencies between 30 MHz-10 GHz.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An interface for mitigating electromagnetic interference (EMI), the interface comprising:
a printed circuit board having:
first and second sides laterally separated from one another by a transition region;
one or more pairs of input pads and output pads, each of the one or more pairs straddling the interface region with the input pads located on the first side of the printed circuit board and the output pads located on the second side of the printed circuit board;
one or more EMI line filters connected between each of the one or more pairs of input and output pads
first and second metallization layers patterned with traces for conducting filtered signals and unfiltered signals, respectively, the first metallization layers sandwiched between first and second ground planes, the second metallization layers sandwiched between third and fourth ground planes, wherein the first and second metallization layers extend throughout both first and second sides of the printed circuit board so as to provide circuit component access to both filtered and unfiltered signals;
a ground barrier disposed in the printed circuit board proximate the interface region; and
a clamshell housing containing the printed circuit board within, the clamshell housing having:
a partition wall aligned with the transition region so as to form first side and second side EMI cages within the clamshell house, the first side of the printed circuit board residing in the first EMI cage and the second side of the printed circuit board residing in the second EMI cage.

2. The interface of claim 1, wherein:
each ground plane comprises copper;
each ground plane defines a ground plane thickness; and
the ground plane thickness is about 0.0014 inch (35 µm).

3. The interface of claim 1, wherein each ground plane is configured to provide at least 40 dB attenuation of EMI frequencies between 30 MHz-10 GHz.

4. The interface of claim 1, further comprising one or more input/output (I/O) connectors disposed on the PCB first side, each of the one or more I/O connectors comprising one or more I/O connector leads and configured to electrically couple the one or more circuit components to one or more external electrical systems.

5. The interface of claim 4, wherein
the first side EMI cage that surrounds the first side and is configured to attenuate transmission of EMI between the first side and an external environment; and
one or more input/output connector apertures disposed on the first side EMI cage, each configured to accommodate an input/output connector;

wherein each of the one or more input/output connectors passes through an associated input/output connector aperture.

6. The interface of claim 5, wherein:
the second side EMI cage that surrounds the second side and is configured to mitigate transmission of EMI between the second side and the external environment.

7. The interface of claim 1, wherein at least one of the one or more signal planes is configured to carry one or more filterable signals from one or more I/O connectors to the interface, wherein each of the one or more signal planes is comprised of one or more input traces, each configured to transmit filterable electrical signals between the one or more I/O connector leads and the one or more EMI line filters.

8. The interface of claim 1, wherein each of the one or more EMI line filters is configured to:
transfer an electrical signal from the respective input pad to the respective output pad; and
mitigate transmission of EMI from the input pad to the output pad and/or from the output pad to the input pad.

9. The interface of claim 8, wherein each of the one or more EMI line filters comprises an inductor, a capacitor, an inductor-capacitor, an inductor-capacitor-inductor, or a capacitor-inductor-capacitor network.

10. The interface of claim 8, wherein each of the one or more EMI line filters is configured to provide EMI attenuation of:
at least 10 dB at 10 MHz; and
at least 45 dB at 1 GHz.

11. An electronic controller, comprising:
a PCB;
the interface of claim 1;
a first side enclosure, configured to provide EMI shielding; and
a second side enclosure, configured to provide EMI shielding;
wherein the first side enclosure and the second side enclosure together form a Faraday shield around the PCB.

12. The electronic controller of claim 11, comprising a clamshell configuration, the clamshell configuration comprising a clamshell top and a clamshell base, wherein:
the partition is physically separable at the PCB into an upper portion and a lower portion;
the clamshell top includes the upper portion; and
the clamshell top is configured to be removably separated from the clamshell base.

* * * * *